United States Patent [19]
Obrecht et al.

[11] Patent Number: 4,617,605
[45] Date of Patent: Oct. 14, 1986

[54] CARRIER ELEMENT FOR AN IC MODULE

[75] Inventors: Werner Obrecht, Wielenbach; Yahya Haghiri-Tehrani; Joachim Hoppe, both of Munich, all of Fed. Rep. of Germany

[73] Assignee: GAO Gesellschaft fur Automation und Organisation, Munich, Fed. Rep. of Germany

[21] Appl. No.: 726,818

[22] Filed: Apr. 24, 1985

Related U.S. Application Data

[63] Continuation of Ser. No. 396,488, Jul. 8, 1982, abandoned.

[30] Foreign Application Priority Data

Jul. 31, 1981 [DE] Fed. Rep. of Germany ....... 3130324

[51] Int. Cl.[4] .............................................. H05K 1/18
[52] U.S. Cl. .................................... 361/220; 235/488; 361/212; 361/401; 361/418
[58] Field of Search ............... 361/212, 220, 401, 418; 235/488

[56] References Cited

U.S. PATENT DOCUMENTS

| | | | |
|---|---|---|---|
| 3,045,143 | 7/1962 | Schickel | 313/325 |
| 3,405,329 | 10/1968 | Loro et al. | 317/234 |
| 3,676,742 | 7/1972 | Russel et al. | 317/33 R |
| 3,774,075 | 11/1973 | Medesha | 361/212 |
| 4,216,577 | 8/1980 | Badet et al. | 29/831 |
| 4,222,516 | 9/1980 | Badet et al. | 235/492 |
| 4,241,829 | 12/1980 | Hardy | 361/412 X |
| 4,303,960 | 12/1981 | Sherwood et al. | 361/212 |
| 4,308,953 | 1/1982 | Cohen | 361/415 X |
| 4,316,231 | 2/1982 | Michel | 361/220 X |
| 4,322,777 | 3/1982 | Ueta et al. | 174/68.5 X |
| 4,361,756 | 11/1982 | Parmentier | 235/487 |

FOREIGN PATENT DOCUMENTS

| | | |
|---|---|---|
| 2229301 | 1/1974 | Fed. Rep. of Germany. |
| 2348630 | 4/1975 | Fed. Rep. of Germany ...... 361/212 |
| 2713936 | 3/1977 | Fed. Rep. of Germany. |
| 2920012 | 5/1979 | Fed. Rep. of Germany. |
| 2830937 | 1/1980 | Fed. Rep. of Germany ...... 361/220 |
| 1430438 | 2/1965 | France. |
| 2337381 | 7/1977 | France ............................... 361/212 |
| 2472330 | 12/1979 | France. |

OTHER PUBLICATIONS

B. G. Kleen, Printed Circuit Spark-Gap Protector, IBM Tech. Disc. Bull., V. 14 #2, p. 638, Jul. 1972.
D. E. DeBar et al., Module Spark Gap, IBM Tech. Disc. Bull. V. 18, No. 7, Dec. 1975.
Capousis et al., Protective Container for Integrated Circuit Modules, IBM Tech. Disc. Bull., V. 17, No. 10, Mar. 1975, pp. 2972 & 2973.

Primary Examiner—R. R. Kucia
Attorney, Agent, or Firm—Sandler & Greenblum

[57] ABSTRACT

A carrier element for an IC module for incorporation into data carriers, in which the IC module is connectd with contact surfaces by means of leads, and the contact surfaces are designed for direct contacting.

In order to protect the Integrated Circuit against destruction due to static charges, measures are provided to dissipate outside the circuit any portions of charge that may occur. In one embodiment, all terminals of the circuit have a low resistance connection with each other. The connection is suspended during each operational phase and is then restored. In a further embodiment, the terminals are bridged by spark gaps. This protective step is advantageous in that it is not necessary to remove and then restore the bridging.

3 Claims, 11 Drawing Figures

CARRIER ELEMENT FOR AN IC MODULE

This is a continuation, of application Ser. No. 396,488, filed July 8, 1982, now abandoned.

The present invention relates to an IC module to be incorporated into identification cards or similar data carriers, whereby the IC module disposed on or in the carrier element is electrically connected with contact surfaces by leads.

German Auslegeschrift 29 20 012 discloses an identification card of the stated kind with an embedded IC module. In this identification card, the module is attached to a separate carrier element with all its leads and contacts. The element is set into a window in the card in such a way that the contact surfaces of the element are readily accessible on the surface of the card.

IC modules suitable for incorporation into identification cards should be of small dimensions and involve both high complexity and minimal energy consumption. The smaller the surface of the module is, the less danger there is of the circuit being destroyed by the inevitable mechanical stress involved in the daily use of the card.

Complex integrated circuits with high packing density and low energy consumption are mainly produced today by so-called "MOS" technology. As is generally known, MOS modules are highly susceptible to static charges. Thus there are definite rules for handling these modules, which must be strictly complied with to protect the components. These relate not only to production and storage but also to processing and operating the module. It is obvious that these rules can only be complied with conditionally when the modules are incorporated into identification cards. The above-mentioned publication does not provide for any special protective measures for the IC module and contacts against possible damage due to static charges, which are a particular source of danger in the daily use of the card.

MOS modules of relatively high complexity which are available today on the market are in fact usually provided with protective devices which are integrated into the switching structure. However the modules must be protected against static charges in spite of these measures. The producers still recommend the observance of a number of protective measures which, however, cannot be observed when the modules are incorporated, for example, into identification cards due to the special conditions involved. One of the protective measures, for example, is that persons or devices that can come in contact with the circuit must be grounded.

The problem on which the invention is based is thus to provide an integrated module which can be incorporated into identification cards and is protected against static charges to a large extent.

This problem is solved according to the invention by having all coupling means on the carrier element exhibit bridging means between them which are receptive to static charges, dissipating the portions of charge that endanger the circuit.

The bridging means can be a low-resistance connection between the contacts or between the leads leading to the contacts. The connection is suspended during each operational phase and is then restored.

In an exemplary embodiment, the connection is produced by means of a contact strip which short-circuits all leads. The strip is part of the carrier element which takes up the circuit and the leads. When the circuit is to be operated, the strip is lifted off the leads, for example by mechanical means, enough for the short-circuit to disappear, as explained below in detail.

In other embodiments of the invention, the bridging is realized by so-called "spark gaps". This type of bridging, which can be used successfully especially when a circuit is already equipped with internal integrated protective devices, is advantageous in that the normal operation of the card is not interfered with. There is no need to remove and reapply the bridging. The spark gap must be dimensioned in such a way that static charges are dissipated before internal structures of the circuit are destroyed by dielectric breakdowns. If the circuit is equipped wih internal protective devices, the spark gap can be arranged in such a way that it only responds to relatively high static charges that endanger the protective devices. For this purpose one can make use of the essential parameters that affect the breakdown voltage of a spark gap, such as the electrode separation, the geometry of the electrodes, the type of dielectric, etc.

In the following, embodiments and further details of the invention shall be described more specifically with reference to the figures.

These show:

FIG. 1 shows an identification card 1 with an embedded integrated circuit.

Figure 1:
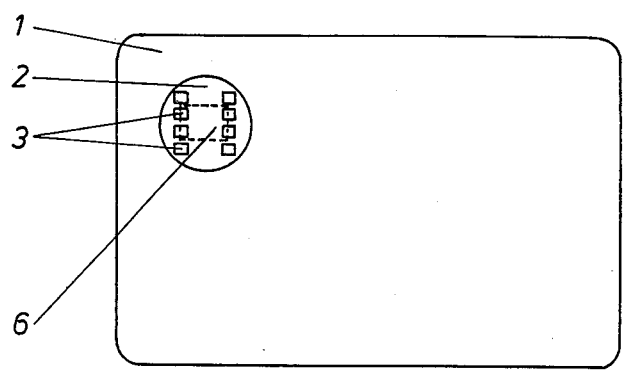
FIG. 1 shows an identification card with an integrated circuit.
Figure 2:
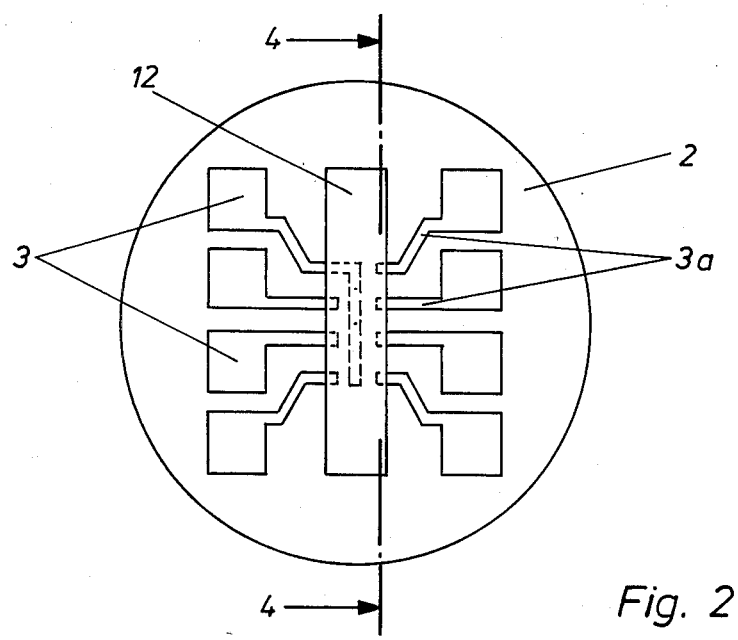
FIG. 2 shows a carrier element with a short-circuit strip.

IC module 6 is disposed on a carrier element 2 along with contacts 3 necessary for the operation of the module. Carrier element 2 is set into a prepared recess in the card and connected with the card laminate.

The circuit is in danger of being destroyed when one of the contacts comes in contact with a static charge which can leak off through the circuit via a second contact which, for example, at the momemt is connected with an object carrying ground potential. The amount of charge that suffices to destroy the circuit or modify its electrical values depends on many factors, including the type of circuit.

It can basically be assumed that the circuits incorporated into identification cards can come in contact with static charges of 10 kV or more via the persons using the cards. The circuit would thus certainly be destroyed by corresponding discharge even if it is a circuit equipped with internal protective devices (quenching diodes) which can compensate static charges ranging from approximately 1 to 2 kV without being damaged.

In the following, we shall describe with reference to various embodiments how circuits which are incorporated into identification cards, for example, can be protected to a large extent against the static charges that may occur during the daily use of the card.

FIGS. 2 to 5 show an embodiment of the invention in which all terminals of the module are short-circuited as long as the identification card or rather the circuit is not in operation. During the operational phases the short-circuit is suspended. In the carrier element 2 with contact surfaces 3 shown, for example, in FIG. 2 (see also cross-section view in FIG. 4), the leads 3a leading to the module are short-circuited by a contact strip 12. Contact strip 12 (FIG. 3) is coated with conductive material 13 and is mechanically biased during its production in such a way that it short-circuits the leads with its conductive layer when attached to the carrier element.

Figures 3, 4, 5:
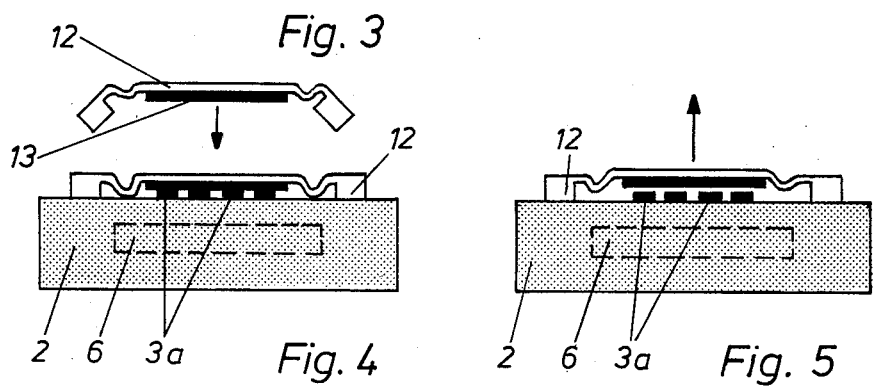
FIG. 3 illustrates the short-circuit strip.
FIG. 4 shows the carrier element of FIG. 2 in cross-section.
FIG. 5 shows the carrier element of FIG. 2 in cross-section during the operational phase.

When the circuit is to be operated, the contact strip is lifted off the leads, as shown in FIG. 5. This can be achieved, for example, by means of a suction pipe integrated into the contact head (not shown in the figures). The short-circuit is automatically restored after the operational phase is over due to the bias of the strip.

The short-circuit between the terminal leads of the module can also be achieved by bridging all contacts by means of a conductive layer. The layer is removed by a specially provided device in the particular test equipment before contacting and then reapplied before the card is returned.

This layer can be a very thin conductive film which "sticks" due to adhesive power on the contact surface. It is also possible to use a self-adhesive conductive film which is stuck to the surface of the identification card at least in the area of the contact surfaces. There are a number of methods for removing and applying the layers, which need not be described in detail here as they are not subject-matter of the present invention.

It may finally be mentioned that the short-circuit can also be achieved by a conductive lacquer. The lacquer is removed in the machine before the operational phase by means of an appropriate solvent and then reapplied before the card is returned to the user.

Figure 6:
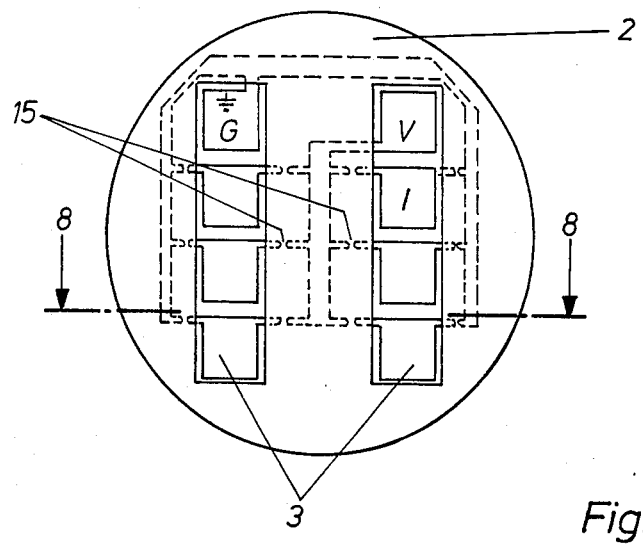
FIG. 6 shows a carrier element equipped with spark gaps.
Figure 8:
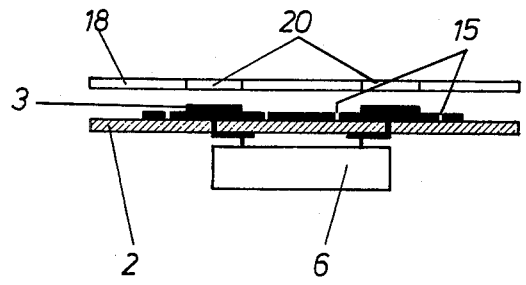
FIG. 8 shows the carrier element of FIG. 6 in cross-section.
Figure 7:
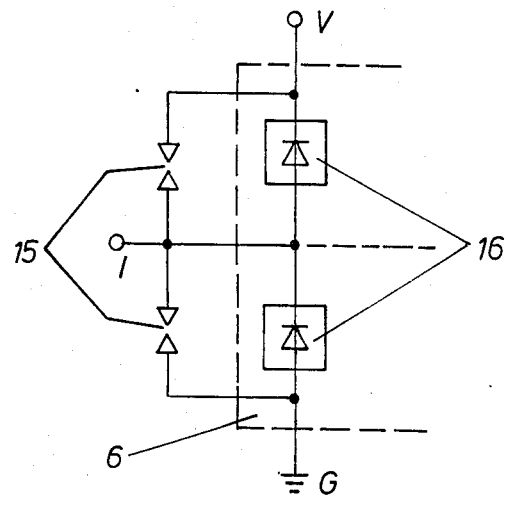
FIG. 7 shows an electrical analog of the arrangement shown in FIG. 6.

In addition to the possibility of short-circuiting the terminal leads of the IC module in periods of potential danger, further embodiments of the invention to protect the module are characterized, as mentioned above, by a bridging means acting like a spark gap. FIGS. 6, 7 and 8 show such an embodiment. This kind of bridging is favorable when the circuit is already equipped internally with protective devices (quenching diodes). The spark gap can then be more easily realized as its dimensions can be based on a higher response threshold.

The protective devices, e.g. networks switched between the circuit input and the grounding or supply terminal, should then compensate unhurt the charge potentials to which the spark gaps do not respond.

In the embodiment shown, it is assumed that the contact surface designated as "G" is used as a grounding and the contact surface designated as "V" is used as the terminal for voltage supply. The contact surface designated as "I" is connected with an input line of the integrated circuit. As is also shown in the greatly schematized electrical block diagram in FIG. 7, both grounding "G" and terminal "V" for voltage supply are connected to input line "I" of integrated circuit 6, each by a spark gap 15. The spark gaps are located parallel to the protective networks 16 (here symbolized by protective diodes) provided within the circuit.

The dielectric strength of spark gaps 15, i.e. the field strength at which the insulating power between the electrodes of the gap disappears, measured in kV/cm, must be smaller than the dielectric strength of protective networks 16 within circuit 6.

If the distance between electrodes with as small a radius of curvature as possible and a dielectric with low dielectric strength is correspondingly small, the spark gaps puncture and the static charge is dissipated before the protective networks and the succeeding circuit units are destroyed. Burn-in of the spark gaps can easily be avoided by appropriate selection of materials, especially as the power of the static charges in question is slight.

In the embodiment shown, all inputs and outputs of the circuit are connected by spark gaps with each other and with the reference potentials, grounding and supply terminal. The selected arrangement of the spark gaps is more or less arbitrary. The number, arrangement and dimensioning of the spark gaps depend on the type of circuit to be protected, and must be chosen accordingly.

As shown in FIG. 6 and also in the cross-section view in FIG. 8, the carrier element may be covered by a thin film 18 to protect the spark gaps against damage and contamination. This film is provided in the area of contact surfaces 3 with recesses 20.

Figure 9:
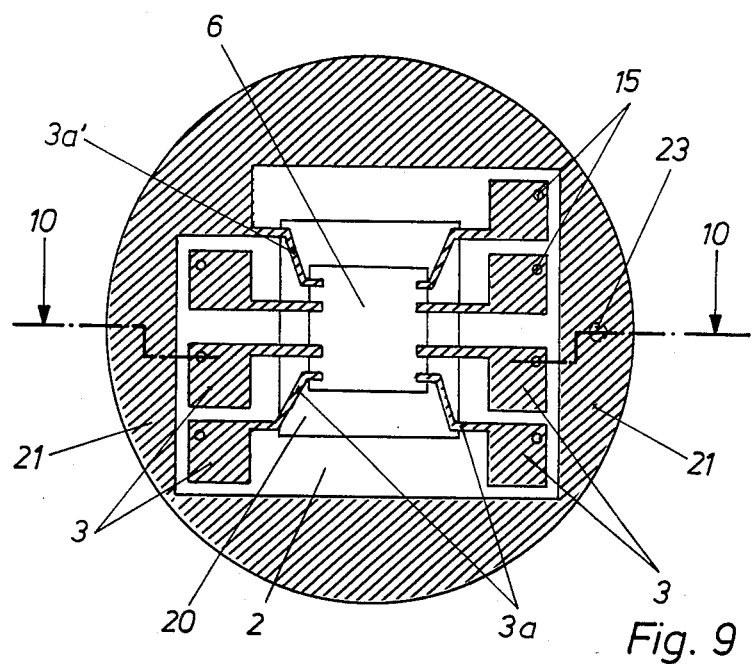
FIG. 9 shows a further example of a carrier element with spark gaps.
Figure 10:
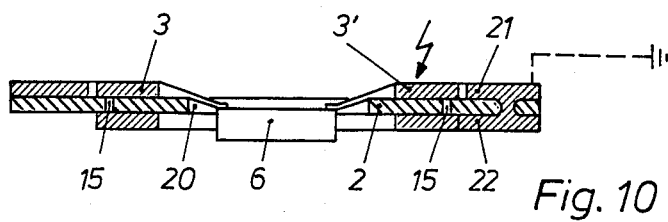
FIG. 10 shows the carrier element of FIG. 9 in cross-section.
Figure 11:
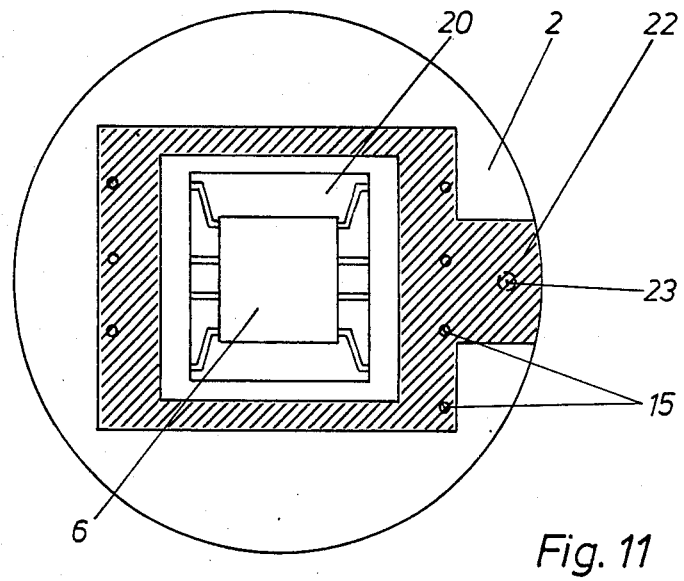
FIG. 11 shows the carrier element of FIG. 9 seen from the back.

FIGS. 9, 10 and 11 show a further embodiment of a spark gap for the protection of integrated circuits against static charges. FIG. 9 shows the front of carrier element 2, FIG. 10 shows a section along lines 10—10 and FIG. 11 shows the back.

IC module 6 disposed in a window 20 of carrier element 2 is connected by leads 3a to contact surfaces 3. Lead 3a', which provides the connection with the grounding of the module, is further connected with a circular conductive lining 21 enclosing all the contacts, which covers the entire surface remaining between the contacts. The distance between lining 21 and the various contact surfaces can be relatively large so that bridging caused, for example, by contamination need not be feared. On the back of the carrier element there is a circular conductive electrode 22 which is essentially congruent with the area taken up by contacts 3. As can be seen in FIG. 10, lining 21 and electrode 22 are electrically connected with each other by a through hole plated line 23. A spark gap 15 in the form of a perforation is provided between each contact surface 3 and the conductive electrode 22 on the back. The electrode separation of the spark gap is determined by the thickness of the carrier element material. Thus an essential parameter for dimensioning the spark gap can be set in a simple manner by appropriate choice of the film thickness.

As already mentioned, the circuit is in danger of being destroyed especially when one of the contact surfaces, for example, picks up a static charge which leaks off through the circuit via another contact surface which is connected, for example, with ground potential.

If this situation arises in the circuit or rather carrier element according to the invention, spark gaps 15 ensure that the charge does not leak off through the circuit, but rather superficially over the conductive linings of the carrier element.

As indicated in FIG. 10 by symbols, a charge of sufficient strength reaching contact surface 3' leaks off, when spark gap 15 punctures, through this electrode 22, through hole plating 23 and lining 21 to the ground.

For the sake of clearness the actual situation is not shown to scale in the cross-section view of FIG. 10. In reality the distance between contact surface 3' and lining 21 is much larger than the distance specified by film 2 between contact surface 3' and electrode 22, which is equal to the electrode separation of spark gap 15.

In the embodiment shown, contact surfaces 3 of the integrated circuit are connected by one spark gap each to the ground connection of the circuit, i.e. the contact ring or lining 21. The contact surfaces are thus mutually bridged by two serially switched spark gaps. This means that a static charge is only compensated between two contact surfaces when the potential difference is relatively high. Obviously, it is also possible to provide spark gaps between the contacts themselves. But this should not be necessary as a general rule when lining 21 covers a large area, since it is highly probable that this lining enclosing all contacts would participate in dissipating a static charge.

An expert knows that the above embodiments are mere examples for the multitude of possibilities, and that the form to be used in practice must be adapted to the individual case at hand.

We claim:

1. In a card having an embedded integrated circuit (IC) module electrically connected by a plurality of leads to individual galvanic contact pads exposed to the surface of the card for communicating with said module, the improvement comprising an electrically conductive ring surrounding the contact pads and being electrically separated from said contact pads, and means on said ring associated with each pad for defining a local gap across which static charges can flow from the contact pad to the conductive ring, the electrically conductive ring and the gaps being covered by an electrically insulating card layer that effects exposure of the pads.

2. In a card having an embedded integrated circuit (IC) module electrically connected by a plurality of leads to individual galvanic contact pads exposed to the surface of the card for communicating with said module, the improvement comprising the combination of an electrically conductive ring member electrically separated from said contact pads and surrounding said contact pads, an electrically insulating film of predetermined thickness, and a grounded electrically conductive layer, said film being sandwiched between said ring and said layer, and means defining a local gap including at least one through-hole in said film underneath each of the contact pads for forming a spark gap from the contact pad to the conductive layer by means of which static charges can flow from the contact pad to the electrically conductive layer.

3. An article comprising:
   (a) an insulating carrier substrate on which an integrated circuit (IC) module is mounted, said module having a plurality of electrical leads;
   (b) a plurality of contact pads on a first surface of the carrier substrate respectively electrically connected to said leads for communicating with said module;
   (c) an electrically conductive ring member on the first surface surrounding said plurality of contact pads;
   (d) an electrically conductive layer on a second surface of said carrier substrate opposite to said plurality of contact pads;
   (e) said ring member and said conductive layer being electrically connected; and
   (f) means defining a spark gap including through-holes in said carrier substrate beneath each contact pad for draining static charges on the contact pads into said conductive layer and said ring member, respectively.

\* \* \* \* \*